(12) United States Patent
Park

(10) Patent No.: US 7,871,850 B2
(45) Date of Patent: Jan. 18, 2011

(54) LIGHT EMITTING DEVICE AND MANUFACTURING METHOD THEREOF

(75) Inventor: Bo Geun Park, Gwangju (KR)

(73) Assignee: LG Innotek Co., Ltd, Seoul (KR)

( * ) Notice: Subject to any disclaimer, the term of this patent is extended or adjusted under 35 U.S.C. 154(b) by 49 days.

(21) Appl. No.: 12/279,497

(22) PCT Filed: Feb. 1, 2007

(86) PCT No.: PCT/KR2007/000547

§ 371 (c)(1),
(2), (4) Date: Aug. 14, 2008

(87) PCT Pub. No.: WO2007/094576

PCT Pub. Date: Aug. 23, 2007

(65) Prior Publication Data

US 2009/0207619 A1      Aug. 20, 2009

(30) Foreign Application Priority Data

Feb. 14, 2006     (KR) ...................... 10-2006-0014092

(51) Int. Cl.
H01L 21/00 (2006.01)
(52) U.S. Cl. .............................. 438/79; 438/82; 438/88; 438/613; 257/E21.126; 257/E21.127; 257/E21.134; 257/E21.296; 257/E21.352; 257/E21.617

(58) Field of Classification Search ................... 438/79, 438/82, 83, 88, 614, 615, 613, 666; 257/E21.126, 257/127, 134, 296, 352, 617
See application file for complete search history.

(56) References Cited

U.S. PATENT DOCUMENTS

| 5,750,421 | A | * | 5/1998 | Kasai et al. ................. 438/106 |
| 5,962,971 | A | * | 10/1999 | Chen ........................... 313/512 |
| 6,274,924 | B1 | * | 8/2001 | Carey et al. ................. 257/676 |
| 6,345,903 | B1 | * | 2/2002 | Koike et al. ................ 362/241 |
| 6,482,664 | B1 | * | 11/2002 | Lee et al. ....................... 438/28 |
| 6,559,379 | B2 | * | 5/2003 | Solanki et al. .............. 174/533 |
| 6,599,768 | B1 | | 7/2003 | Chen et al. |
| 6,943,433 | B2 | | 9/2005 | Kamada et al. |

FOREIGN PATENT DOCUMENTS

KR     10-2006-009684 A     2/2006
KR     10-2007-0014267 A    2/2007

* cited by examiner

*Primary Examiner*—David Nhu
(74) *Attorney, Agent, or Firm*—Birch, Stewart, Kolasch & Birch, LLP

(57) ABSTRACT

Disclosed are a light emitting device and a method for manufacturing the same. The light emitting device includes a substrate having a lead frame, a light emitting diode mounted on the substrate, a mold member formed on the substrate and the light emitting diode, and a reflecting member having an opening portion at one side thereof and being inclined at an outer portion of the mold member.

22 Claims, 3 Drawing Sheets

[Fig. 1]
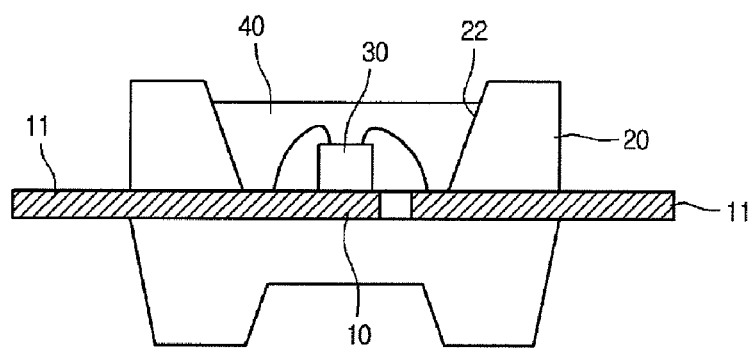
RELATED ART
[Fig. 2]
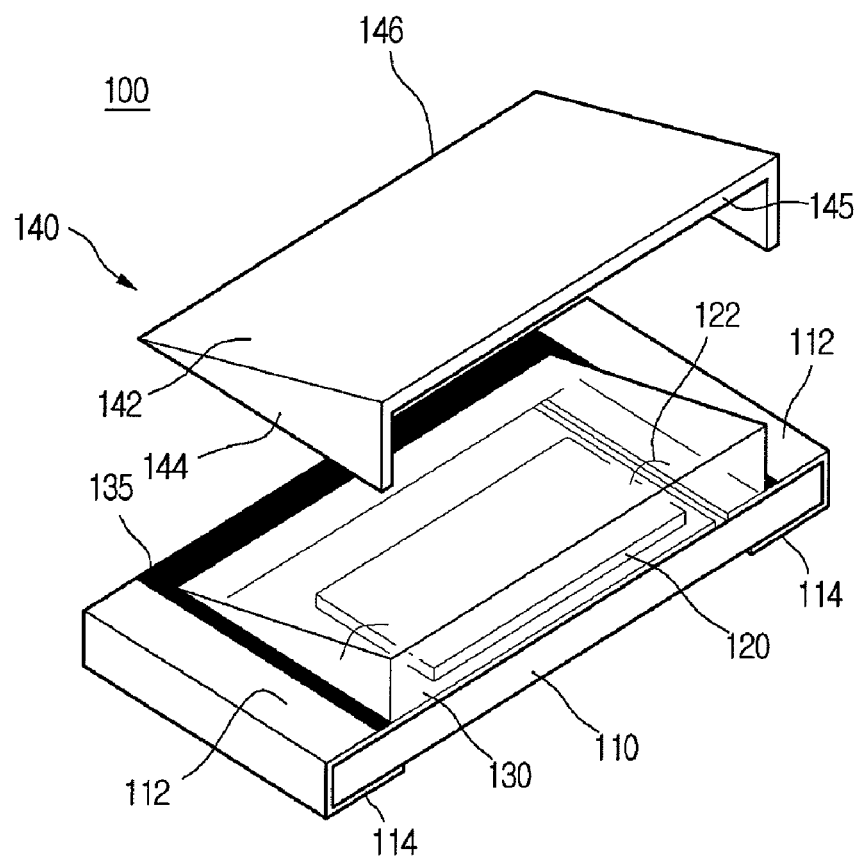

[Figure 3]
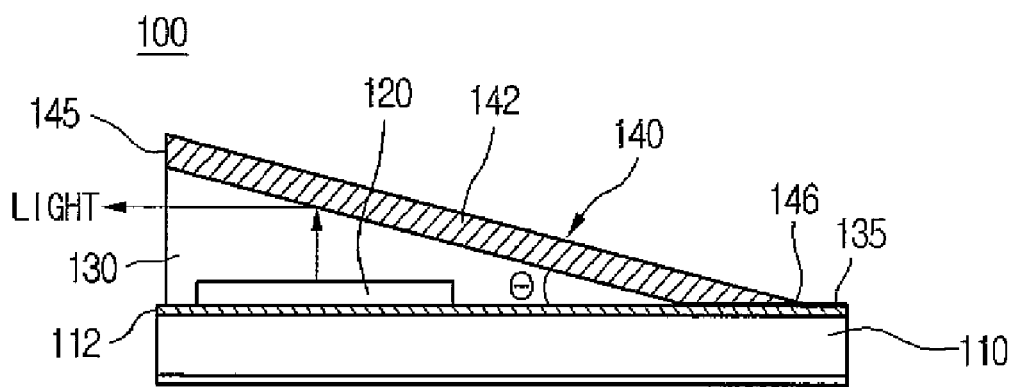
[Figure 4]
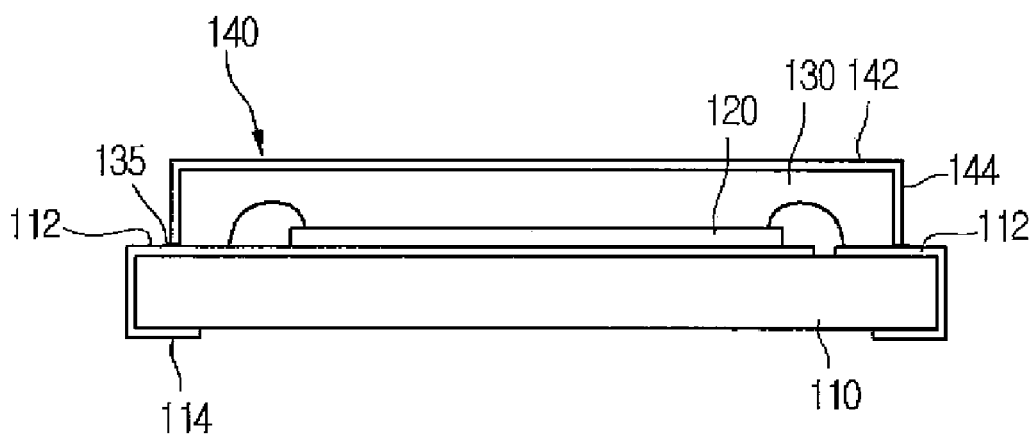
[Figure 5]
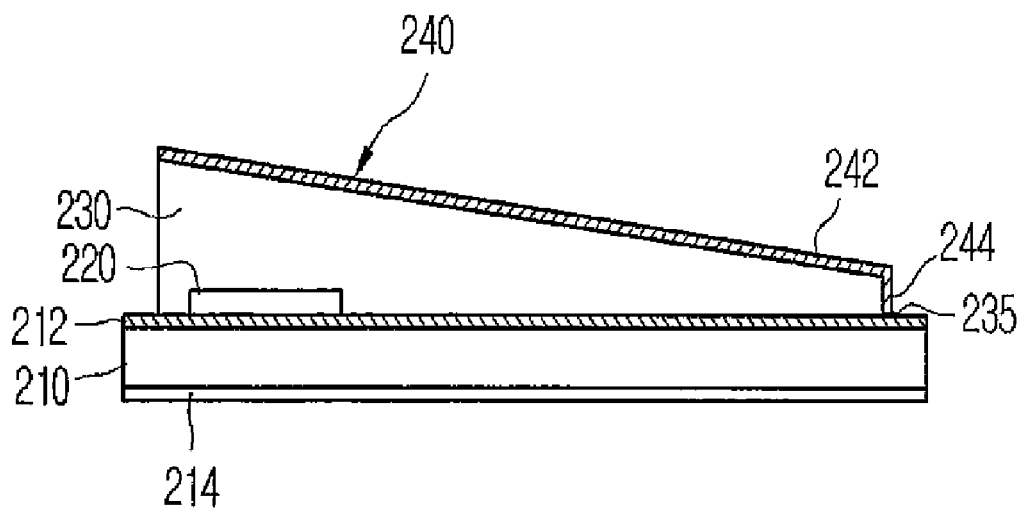

【Figure 6】
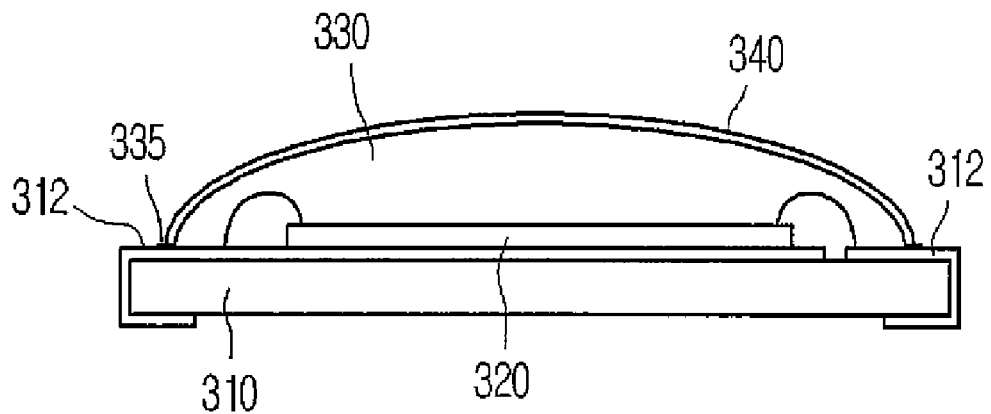
【Figure 7】
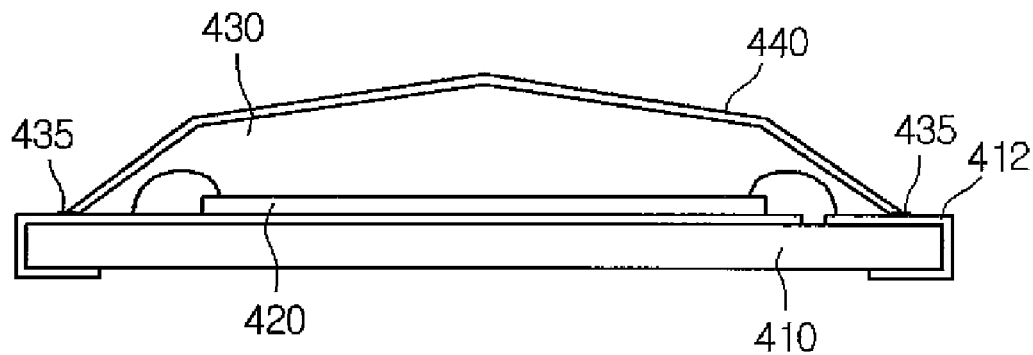
【Figure 8】
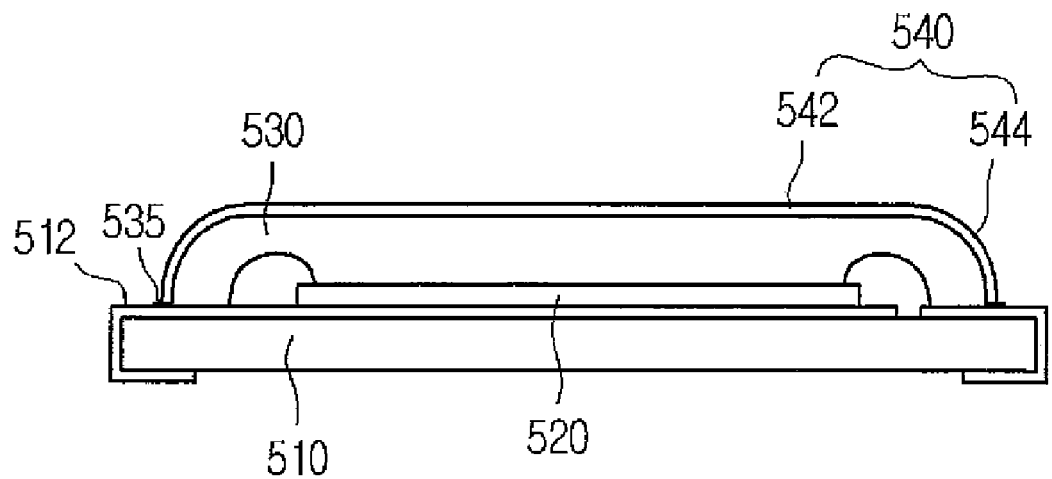

LIGHT EMITTING DEVICE AND MANUFACTURING METHOD THEREOF

CROSS REFERENCE TO RELATED APPLICATIONS

This application is a 371 of PCT/KR2007/000547 filed on Feb. 1, 2007, which claims priority to KR patent application 10-2006-0014092 filed on Feb. 14, 2006.

TECHNICAL FIELD

The embodiment of the present invention relates to a light emitting device and a method for manufacturing the same.

BACKGROUND ART

Light emitting diodes (LEDs) constitute a light emitting source by using GaAs, AlGaAs, GaN, InGaN, and InGaAlP-based compound semiconductor materials, thereby realizing various colors. Such LEDs have been applied to various fields such as a lightening indicator, a character indicator, and an image indicator using colors.

In general, characteristics of the LEDs are determined depending on materials, colors, brightness, and the range of brightness intensity of a compound semiconductor, and mainly affected by a package structure of mounting an LED chip.

FIG. 1 is a sectional view showing a related art light emitting device.

Referring to FIG. 1, a reflecting cup 20 is fabricated through an injection molding process using white plastics, and lead frames 11, which are electrically insulated from each other, are formed in a cavity of the reflecting cup 20. The lead frame 11 is provided with an LED chip electrically bonded thereto by a wire. Both end portions of the lead frames 11 pass through the reflecting cup 20 such that the end portions are used as electrode terminals.

The cavity of the reflecting cup 20 is filled with a mold part 40 including transparent epoxy resin. The mold part 40 includes a yellow fluorescent substance such as YAG:Ce fluorescent substance. The yellow fluorescent substance absorbs blue light emitted from a blue LED chip 30 and is excited by means of the blue light, so that yellow light can be emitted. The yellow light is mixed with the blue light so that white light is emitted. Accordingly, a white LED can be realized.

In this case, the reflecting cup 20 has a length in the range of about 2 mm to 4 mm, a width in the range of about 0.4 mm to 2 mm, and a height in the range of about 0.6 mm to 2 mm.

In such a light emitting device, the lead frame 11 is arranged in the cavity of the reflecting cup 20, and the LED chip 30 is mounted on the lead frame 11. However, the blue LED chip 30 cannot easily be mounted due to the space limitation of the cavity of the reflecting cup 20. Accordingly, the productivity of the light emitting device may decrease, and the defect rate of the light emitting device may increase.

In addition, since the mold part 40 having the fluorescent substance cannot be easily inserted into the reflecting cup 20 due to the narrow cavity of the reflecting cup 20, the color reproduction and the light efficiency of white light emitted from a side light emission type LED may be degraded.

DISCLOSURE

Technical Problem

An embodiment of the present invention provides a side-emission type light emitting device.

An embodiment of the present invention provides a light emitting device and a method for manufacturing the same, capable of guiding light emitted from a light emitting diode to an opening portion formed at one side of the light emitting device by forming a reflecting member upwardly inclined toward the opening portion on a substrate.

Technical Solution

An embodiment of the present invention provides a light emitting device comprising a substrate including lead frames, a light emitting diode on the substrate, a mold member on the substrate and the light emitting diode, and a reflecting member including an opening portion at one side thereof and being inclined at an outer portion of the mold member.

An embodiment of the present invention provides a method for manufacturing a light emitting device, the method comprising the steps of mounting a light emitting diode on at least one of lead frames of a substrate, forming a mold member on the light emitting diode and the substrate, and forming a reflecting member, which is inclined toward an opening portion formed at one side thereof, around the mold member.

Advantageous Effects

In a light emitting device and a method for manufacturing the same according to embodiments of the present invention, a reflecting member having an inclined structure is additionally provided over a light emitting diode, thereby easily mounting the light emitting diode and molding a mold member. Accordingly, the yield rate of the light emitting device can be improved.

In addition, heat generated from the inside of the light emitting device can be effectively dissipated by using the reflecting member so that the degradation of efficiency of the light emitting diode caused by the heat can be prevented.

DESCRIPTION OF DRAWINGS

FIG. 1 is a sectional view showing a related art light emitting device;

FIG. 2 is an exploded perspective view of a light emitting device according to a first embodiment of the present invention;

FIG. 3 is a side sectional view showing a light emitting device according to a first embodiment of the present invention;

FIG. 4 is a front view showing a light emitting device according to a first embodiment of the present invention;

FIG. 5 is a side sectional view showing a light emitting device according to a second embodiment of the present invention;

FIG. 6 is a front view showing a light emitting device according to a third embodiment of the present invention;

FIG. 7 is a front view showing a light emitting device according to a fourth embodiment of the present invention; and FIG. 8 is a front view showing a light emitting device according to a fifth embodiment of the present invention.

BEST MODE

Hereinafter, a light emitting device according to embodiments of the present invention will be described with reference to accompanying drawings.

It will be understood that when an element is referred to as being "on" or "under" a layer, it can be directly on/under the layer, and one or more intervening layers may also be present. FIGS. 2 to 4 show a light emitting device 100 according to a first embodiment of the present invention. FIG. 2 is an exploded perspective view of the light emitting device 100, FIG. 3 is a side sectional view showing the light emitting device 100, and FIG. 4 is a front view showing the light emitting device 100. Referring to FIGS. 2 to 4, the light emitting device 100 includes a substrate 110, a light emitting diode 120, a mold member 130, and a reflecting member 140.

The substrate 110 includes a sapphire substrate, an FR-4 substrate, or a PCB. In addition, the substrate 110 is provided with a plurality of lead frames 112 electrically insulated from each other. The lead frames 112 extend along at least a portion of a top surface, a side surface, and a bottom surface of the substrate 110 such that the lead frames are used as electrode terminals 114 at a lower portion of the substrate 110. In this case, the substrate 110 may be realized as a support member including non-conductive materials such as plastics.

In addition, the lead frames 112 include metals such as Ag or Al having a high reflection coefficient, and the surfaces of the lead frames 112 may be coated with the materials having the high reflection coefficient.

The light emitting diode 120 is bonded on the lead frames 112 by using conductive or non-conductive adhesion and electrically connected to the lead frames 112 by using a wire 122 in the shape of a LED chip. The light emitting diode 120 is mounted through a wire bonding scheme, a die bonding scheme, or a flip-chip bonding scheme according to the type of the LED chip, such as a vertical LED chip or a horizontal LED chip, and the mounting scheme for the LED chip.

At least one light emitting diode 120 may be mounted on the substrate. The light emitting diode 120 includes at least one of LED chips using AlGaN, InGaN, GaN, InGaAlP, AlGaAs, and GaAs-based compound semiconductor materials. For example, all three-color (red/green/blue) LED chips or only at least one blue LED chip may be mounted on the substrate 110. According to the embodiment, since space limitation does not exist when the light emitting diode 120 is mounted on the substrate 110, the light emitting diode 120 can be easily mounted on the substrate 110. In addition, a protection device such as a zener diode may be mounted on the substrate 110.

The mold member 130 is formed on the substrate 110 while being inclined with respect to the top surface of the substrate 100. The mold member 130 seals the light emitting diode 120 and electrical connection parts thereof by using transparent epoxy or silicon resin.

The mold member 130 may be formed through a transfer molding scheme using epoxy molding compound (EMC). According to the transfer molding scheme, the substrate 110 is arranged on a molding press equipped with a mold having a desired shape, and the EMC is injected into the mold at a predetermined pressure or more, thereby transfer-molding the mold member 130. In this case, the epoxy resin may be selected by taking into account a characteristic of easily sticking to the substrate 110 or the lead frames 112 together with high light transmittance and low stress.

In addition, a fluorescent substance may be added to the mold member 130 or not depending on types of the light emitting diode 120. For example, when three-color (Red, Green, and Blue) LED chips are mounted, white light can be emitted by using the three-color LED chips. For this reason, a fluorescent substance need not be added to the mold member 130. Further, when only a blue LED chip is mounted, a yellow fluorescent substance is added to the mold member 130 such that white light can be emitted. In addition, when an ultraviolet (UV) LED chip is mounted, red, green, and blue fluorescent substance may be added to the mold member 130.

In order to add a fluorescent substance to the mold member 130, a fluorescent pigment, which is excited in reaction with light generated from the light emitting diode 120, is mixed with mold compound epoxy, and then the mixture is molded with the mold member 130 through the transfer molding scheme. The fluorescent substance includes a YAG:Ce or silicate based yellow fluorescent substance. Thus, the light generated from the blue LED chip is mixed with yellow light emitted from the yellow fluorescent substance, so that white light is realized.

The top surface of the mold member 130 is inclined relative to the substrate 110. In other words, the mold member 130 is upwardly inclined toward an opening portion at one side of the reflecting member 140 (e.g., □). In this case, as shown in FIG. 3, the top surface of the mold member 130 is inclined at an angle in the range of 15° to 85° from the substrate 110. Such a mold member 130 has a longitudinal length in the range of about 3.5 mm to 5 mm, a transverse length in the range of about 1 mm to 2 mm, and the maximum height in the range of about 1 mm to 2.5 mm. At least one surface (e.g., top surface) of the mold member 130 according to the present invention can be inclined or bent in a multi-step structure. The mold member 130 may have an external appearance of a semi-circular shape, a polygonal shape or an emboss shape.

Further, the mold member 130 according to the embodiment may be molded through a molding scheme of heat-pressing an epoxy sheet, a thermal scheme of heat-treating liquid-phase molding materials, or an injection-molding scheme, as well as the transfer molding scheme.

The reflecting member 140 is formed on the mold member 130. The reflecting member 140 has an opening portion at one side thereof, and the top surface 142 and both side surfaces 144 of the reflecting member 140, except for the opening portion, cover the mold member 130.

Such a reflecting member 140 has a shape and an inclination angle corresponding to those of the mold member 130. The top surface 142 of the reflecting member 140 is downwardly inclined from a front end portion 145 to a rear end portion 146, and is inclined toward the opening portion. Accordingly, light generated from the light emitting diode 120 may be directly emitted to the opening portion while passing through the mold member 130. In addition, the light may be reflected from the reflecting member 140 such that the light is emitted.

Such a reflecting member 140 may be formed with a shape the same as the external shape of the mold member 130, and the top surface 142 of the reflecting member 140 may be inclined with an angle identical to or different from that of the top surface of the mold member 130.

The reflecting member 140 may be formed by using materials having a high reflection coefficient or/and a low light absorption coefficient. In detail, the reflecting member 140 is coated with metals such as Al, Ag, and Au or oxide-based materials having a high reflection coefficient. For example, the Ag has a high reflection coefficient in the range of 96% to 98% or more. The reflecting member 140 may formed by depositing metals having a high reflection coefficient thereon through metal deposition, metal coating, electrolytic plating, or electroless plating.

In addition, an insulating member 135 may be formed on the lead frame 112 corresponding to the reflecting member 140. The insulating member 135 includes an insulating tape or non-conductive adhesion or gluing agent including epoxy. In addition, the insulating member 135 is formed between the lead frame 112 and the reflecting member 140 so that the reflecting member 140 is electrically insulated from the lead frame 112.

Meanwhile, according to a procedure of manufacturing the light emitting device, the light emitting diodes 120 are adhered to N×M chip mounting areas (N and M are natural numbers exceeding 1) and then bonded to the lead frames 112 of the substrate 110 by using a wire. Then, the mold member 123 including epoxy resin or silicon resin is molded and cured on the chip mounting areas of the substrate 110. At this time, the top surface of the mold member 130 is inclined at a predetermined angle.

Then, the reflecting member 140 including metal material having a high reflection coefficient is formed on the surface of the mold member 130. After forming the reflecting member 140, a sawing process is performed in a package unit of the light emitting device so that the individual diode packages are prepared. At this time, since one side of the mold member 130 is cut, the opening portion of the reflecting member 140 is formed. Hereinafter, the operational procedure of the light emitting device will be described.

As shown in FIGS. 2 and 4, the light emitting diode 120 mounted on the substrate 110 receives current through the lead frames 112 so as to emit light. A portion of the emitted light passes through the mold member 130 so that the portion of the light is directly emitted to the opening portion at one side of the reflecting member 140. Remaining portions of the emitted light are reflected from the top surface and side surfaces of the reflecting member 140 positioned at the upper portion and both side portions of the light emitting diode 120 and then guided to the opening portion. At this time, light incident to the lead frame 112 is reflected again.

When white light is realized by using a blue LED chip and a fluorescent substance, a portion of light passing through the mold member 130 is excited by a yellow fluorescent substance added to the mold member 130 so that yellow light is emitted. Thus, the yellow light of the yellow fluorescent substance is mixed with blue light emitted from the blue light emitting diode 120 so that the white light is emitted.

In addition, when white light is realized by using three-color (red, green, and blue) LED chips, lights generated from the LED chips pass through the transparent mold member, are reflected by the reflecting member, and then emitted to the opening portion of the reflecting member. At this time, the thee-color lights are mixed with each other at the outside/inside of the mold member and then realized as the white light.

FIG. 5 is a side sectional view showing a light emitting device according to a second embodiment of the present invention.

As shown in FIG. 5, a light emitting diode 220 is mounted on at least one of lead frames 214 of a substrate 210, and a mold member 230 having an inclined structure is molded on the light emitting diode 220. When the mold member 230 is molded, the rear surface of the mold member 230 is formed at a right angle such that the rear surface 244 of a reflecting member 240 formed over the mold member 230 can be formed at a right angle or an angle in the range of 60 degrees to 120 degrees. In this case, an insulating member 235 electrically insulates the reflecting member 240 from a lead frame 212.

A top surface 242 and the rear surface 244 of the reflecting member 240 reflect light generated from the light emitting diode 220 to an opening portion at one side of the reflecting member 240.

FIG. 6 is a front view showing a light emitting device according to a third embodiment of the present invention.

As shown in FIG. 6, a reflecting member 340 has an external appearance of a semi-circular shape identical to that of a mold member 330. The semi-circular reflecting member 340 is inclined similarly to the structure shown in FIGS. 3 and 5. In addition, the reflecting member 340 is electrically insulated from a lead frame 312 by an insulating member 335.

In such a light emitting device, light generated from a light emitting diode 320 mounted on at least one of the lead frame 312 of a substrate 310 is reflected toward an opening portion due to the semi-circular inclination structure of the light reflecting member 340.

FIG. 7 is a front view showing a light emitting device according to a fourth embodiment of the present invention. As shown in FIG. 7, an external appearance of a reflecting member 440 has a polygonal shape corresponding to that of a mold member 430. The polygonal reflecting member 440 is inclined similarly to the structure shown in FIGS. 3 and 5. In addition, the reflecting member 440 is electrically insulated from a lead frame 412 by an insulating member 435.

In such a light emitting device, light generated from a light emitting diode 420 mounted on at least one of the lead frames 412 of a substrate 410 is reflected toward an opening portion by a polygonal inclination structure of the reflecting member 440. FIG. 8 is a front view showing a light emitting device according to a fifth embodiment of the present invention. As shown in FIG. 8, an external shape of a reflecting member 540 is formed with a structure in which a top surface 542 of the reflecting member 540 is plane, and both side surfaces thereof are curved corresponding to that of a mold member 530. The top surface 542 of the reflecting member 540 is inclined similarly to the structure shown in FIGS. 3 and 5.

In such a light emitting device, light generated from a light emitting diode 520 mounted on at least one of the lead frame 512 of a substrate 510 is reflected toward an opening portion by an inclination structure of the reflecting member 540.

In another modified structure according to the present invention, both side surfaces of a reflecting member as well as a top surface thereof may be inclined. In other words, the interval between both sides of the reflecting member becomes narrowed toward a rear end portion from a front end portion of the reflecting member. Accordingly, the top surface and both side surfaces of the reflecting member are upwardly inclined toward an opening with respect to light incident on a light emitting diode so that external light efficiency can be increased.

A light emitting device according to the present invention is a side light emission type LED package, and the height and the inclination angle of a mold member are adjusted according to products so that the size of the package can be changed. Accordingly, an orientation angle and optical power can be improved.

Accordingly, although embodiments of the present invention are described in detail, it must be noted that the embodiments are for the purpose of only description, but not the limitation thereof. In addition, those skilled in the art will appreciate that various modifications, additions and substitutions are possible, without departing from the scope and spirit of the invention.

INDUSTRIAL APPLICABILITY

In a light emitting device and a method for manufacturing the same according to embodiments of the present invention, a reflecting member having an inclination structure is additionally formed over a light emitting diode, thereby easily installing a light emitting diode and molding a mold member and improving the production yield rate of the light emitting device. In addition, since heat can be effectively dissipated by using a reflecting member, the degradation of efficiency of the light emitting diode caused by the heat can be prevented.

The invention claimed is:

1. A light emitting device, comprising:
   a substrate including a plurality of electrodes;
   a light emitting diode on the substrate and electrically connected to the plurality of electrodes;
   a mold member on the substrate and the light emitting diode;
   a reflecting member formed on the mold member; and
   an insulating member disposed among the reflecting member and the plurality of electrodes,
   wherein the reflecting member includes a metal material.

2. The light emitting device as claimed in claim 1, wherein the mold member includes epoxy resin or silicon resin.

3. The light emitting device as claimed in claim 1, wherein the mold member comprises a fluorescent substance absorbing a portion of light emitted from the light emitting diode so as to change a wavelength of the light emitting diode.

4. The light emitting device as claimed in claim 1, wherein the reflecting member is inclined toward an opening portion at an angle in a range of 15° to 85° relative to the substrate.

5. The light emitting device as claimed in claim 1, wherein the reflecting member includes oxide-based reflection metal or metal including one of Al or Ag.

6. The light emitting device as claimed in claim 1, wherein the reflecting member has one of a polygonal shape, a semi-circular shape, or a circular-planar shape.

7. The light emitting device as claimed in claim 1, wherein the insulating member includes non-conductive adhesion or non-conductive gluing agent.

8. The light emitting device as claimed in claim 1, wherein the light emitting diode includes at least one light emitting diode chip including one selected from the group consisting of AlGaN-based, InGaN-based, GaN-based, InGaAlP-based, AlGaAs-based, and GaAs-based compound semiconductor materials on the substrate.

9. The light emitting device as claimed in claim 1, wherein at least one side surface of the reflecting member is inclined at an angle in a range of 60° to 120° from the substrate.

10. The light emitting device as claimed in claim 1, wherein the light emitting diode is bonded to the plurality of electrodes of the substrate through a wire-bonding scheme or a flip chip-bonding scheme.

11. The light emitting device as claimed in claim 1, wherein the plurality of electrodes extend along at least a portion of a top surface, a side surface, and a portion of a bottom surface of the substrate.

12. The light emitting device as claimed in claim 1, wherein the plurality of electrodes include Ag or Al.

13. The light emitting device as claimed in claim 1, comprising a zener diode on the substrate.

14. The light emitting device as claimed in claim 1, wherein the mold member has a surface which has one of a semi-circular shape, a polygonal shape or an emboss shape.

15. The light emitting device as claimed in claim 1, wherein the reflecting member includes an opening portion.

16. The light emitting device as claimed in claim 1, wherein the reflecting member is located on at least one side surface of the mold member.

17. A light emitting device, comprising:
    a substrate including a plurality of electrodes;
    a light emitting diode on the substrate and electrically connected to the plurality of electrodes;
    a mold member on the substrate and the light emitting diode;
    a reflecting member formed on the mold member; and
    an insulating member disposed among the reflecting member and the plurality of electrodes,
    wherein the reflecting member includes a metal material and is inclined with respect to a top surface of the substrate.

18. The light emitting device as claimed in claim 17, wherein the reflecting member includes an opening portion, and
    wherein the reflecting member is located on at least one side surface of the mold member except for the opening portion.

19. The light emitting device as claimed in claim 17, wherein an opening portion of the reflecting member is formed at a side surface of the mold member.

20. The light emitting device as claimed in claim 17, wherein an upper surface of the mold member is inclined at an angle of 15° to 85° from a top surface of the substrate.

21. A light emitting device, comprising:
    a substrate including a plurality of electrodes;
    a light emitting diode on the substrate and electrically connected to the plurality of electrodes;
    a mold member on the substrate and the light emitting diode; and
    a reflecting member formed on the mold member and including an opening portion,
    wherein the reflecting member includes a metal material having at least one of Al or Ag.

22. The light emitting device as claimed in claim 21, further comprising:
    an insulating member formed on the plurality of electrodes and disposed around a periphery of the mold member,
    wherein the reflecting member is formed on the insulating member.

* * * * *